US012080525B2

(12) United States Patent
Vanhulsel et al.

(10) Patent No.: US 12,080,525 B2
(45) Date of Patent: Sep. 3, 2024

(54) APPARATUS FOR INDIRECT ATMOSPHERIC PRESSURE PLASMA PROCESSING

(71) Applicant: VITO NV, Mol (BE)

(72) Inventors: Annick Vanhulsel, Mol (BE); Erwin Van Hoof, Mol (BE); Jan Cools, Mol (BE)

(73) Assignee: VITO NV, Mol (BE)

( * ) Notice: Subject to any disclaimer, the term of this patent is extended or adjusted under 35 U.S.C. 154(b) by 0 days.

(21) Appl. No.: 17/713,666

(22) Filed: Apr. 5, 2022

(65) Prior Publication Data

US 2022/0230854 A1 Jul. 21, 2022

Related U.S. Application Data

(63) Continuation of application No. 15/335,992, filed on Oct. 27, 2016, now abandoned.

(30) Foreign Application Priority Data

Oct. 28, 2015 (EP) .................................... 15191844

(51) Int. Cl.
*H01J 37/32* (2006.01)
*H05H 1/24* (2006.01)

(52) U.S. Cl.
CPC .. *H01J 37/32532* (2013.01); *H01J 37/32009* (2013.01); *H01J 37/3244* (2013.01);
(Continued)

(58) Field of Classification Search
CPC ........... H01J 37/32009; H01J 37/32091; H01J 37/32403; H01J 37/3244; H01J 37/32532;
(Continued)

(56) References Cited

U.S. PATENT DOCUMENTS 5,863,337 A * 1/1999 Neuman ................ C23C 16/401
118/718
6,187,101 B1 * 2/2001 Yoshizawa .......... C23C 16/4401
118/718

(Continued)

*Primary Examiner* — Benjamin Kendall
(74) *Attorney, Agent, or Firm* — Kolitch Romano Dascenzo Gates LLC (57) ABSTRACT

Apparatus for plasma processing of a continuous fiber, comprising a first and a second plasma torch. Each plasma torch comprises oppositely arranged electrodes to define a plasma discharge chamber between the electrodes. The plasma discharge chamber comprises an inlet and an outlet for passing a plasma forming gas between the electrodes. The apparatus further comprises an afterglow chamber in fluid communication with the outlets of the plasma discharge chambers, which comprises a substrate inlet and a substrate outlet arranged at opposite sides of the outlets of the plasma discharge chambers. A transport system is configured to continuously transport the fiber from the substrate inlet to the substrate outlet through the afterglow chamber. The substrate inlet comprises an aperture having a cross-sectional size substantially smaller than a cross-sectional size of the afterglow chamber. The outlets of the plasma torches face each other and exhaust plasma activated species into the afterglow chamber.

19 Claims, 3 Drawing Sheets

(52) U.S. Cl.
CPC ......... *H05H 1/245* (2021.05); *H05H 2240/10* (2013.01); *H05H 2245/40* (2021.05)

(58) Field of Classification Search
CPC ............ H01J 37/3277; H01J 37/32825; H05H 1/2406; H05H 1/26; H05H 2001/2412; H05H 2001/245; H05H 2001/3431; H05H 2001/4697; H05H 2240/10; H05H 2245/123; H05H 1/2431; H05H 1/246; H05H 1/245; H05H 2245/40
See application file for complete search history.

(56) References Cited

U.S. PATENT DOCUMENTS

| | | | |
|---|---|---|---|
| 7,435,980 B2 * | 10/2008 | Nakao | G21K 5/10 250/493.1 |
| 2008/0308535 A1 * | 12/2008 | Rego | H05H 1/2406 219/121.52 |
| 2009/0133714 A1 * | 5/2009 | Yamazaki | H01J 37/32357 134/1.1 |
| 2009/0183675 A1 * | 7/2009 | Pinarbasi | H01L 21/67109 118/500 |
| 2011/0143019 A1 * | 6/2011 | Mosso | C23C 16/26 427/209 |

* cited by examiner

FIG. 3

APPARATUS FOR INDIRECT ATMOSPHERIC PRESSURE PLASMA PROCESSING

CROSS-REFERENCES

The following applications and materials are incorporated herein, in their entireties, for all purposes: European Patent Application No. 15191844.8, filed Oct. 28, 2015. However, such material is only incorporated to the extent that no conflict exists between the incorporated material and the statements and drawings set forth herein. In the event of any such conflict, including any conflict in terminology, the present disclosure is controlling.

TECHNICAL FIELD

The present disclosure is related to apparatuses and methods for indirect atmospheric pressure plasma processing, in particular where the substrate to be plasma processed is kept remote from the plasma discharge zone.

With indirect or remote plasma treatment of substrates, as opposed to in-situ plasma treatment, the substrate is not passed through the plasma discharge zone, in which an atmospheric pressure plasma is maintained between electrodes and activated species are formed. Instead, the substrate is positioned at a location remote from the plasma discharge zone and the plasma-activated species are transported to the remote location where they are made to react with the substrate. Remote plasma treatment is often preferred over in-situ treatment, in particular for cases in which in-situ plasma treatment would cause charging of the substrate surface and therefore undesirable interaction with the electric field of the plasma discharge. This is particularly the case for substrate materials having at least some degree of electrical conductivity.

INTRODUCTION

An apparatus for indirect or remote atmospheric pressure plasma processing is known from WO 2009/080662 2009 Jul. 2. The apparatus comprises a multitude of single microchannels in which a plasma is formed and which are circumferentially arranged around a treatment zone. High gas velocities up to transonic flow conditions in the discharge zone are generated while maintaining moderate flow rates. The resulting superimposition of high drift velocity in the process gas flow and the inherent diffusion movement results in a prolonged displacement distance of activated species into the treatment zone. The treatment zone is cylindrical and wrapped or enveloped by the plasma microchannels. A carrier gas with particulate material is made to flow through the treatment zone. The process gas with activated species admixes with the carrier gas in the treatment zone to perform a surface treatment of the particulate material. A drawback of the above apparatus is that the concentration of plasma activated species in the treatment zone is not uniform in a radial direction.

US 2003/0051993 2003 Mar. 20 describes an apparatus for atmospheric plasma processing of a PAN fiber. The PAN fiber is drawn through a cylindrical hull. A number of plasma discharge forming capillaries are arranged radially around the cylindrical hull. A drawback of the above apparatus is that the surface activation of the PAN fiber is low due to air entrained with the PAN fiber. For an effective plasma treatment, a long chamber is required with a large number of plasma capillaries, or the transport speed of the fiber must be kept low.

U.S. Pat. No. 8,227,051 2012 Jul. 24 describes in relation to FIG. 2B an indirect exposure plasma treatment of a carbon fiber. The fiber is pulled or placed into the exhaust flow from an atmospheric plasma device exposing the fiber to contact with the convected chemical active species generated by the plasma. The atmospheric pressure plasma device is configured to operate using background gas preferably comprising air, or any other oxygen containing gas mixtures including pure oxygen, that promotes the transport of short-lived reactive oxidative species to the fiber via a sufficiently high exhaust velocity. The plasma operating conditions including the size of the plasma volume, the composition of the processing gas, gas flow rates, and the energizing conditions of the electrical device generating the plasma, are adjusted to yield the desired surface modifications within the required residence time. Deleterious effects on fiber surface topography are minimized by the indirect exposure process because the fibers are located away from the bulk of the plasma and do not undergo direct ion bombardment. In the apparatus as depicted in FIG. 2B of the above document, an inhomogeneous treatment of the carbon fiber surface is obtained, since the side of the fiber facing the plasma discharge apparatus is more exposed to the plasma activated species than the side opposite the plasma discharge apparatus. As a result, the residence time of the carbon fiber must be prolonged, or the fiber must be turned and pulled a second time through the same apparatus.

SUMMARY

An objective of aspects of the present disclosure is to overcome one or more of the above drawbacks. One objective of aspects of the present disclosure is to improve uniform and homogeneous plasma processing of the substrate surface. Another objective of aspects of the present disclosure is enabling a prolonged and more intimate contact between the reactive species exhausted from the plasma discharge and the substrate. Yet another objective is to improve plasma processing of the substrate surface, in particular for non-oxidative plasma treatments, i.e., treatments involving a substantially oxygen-free plasma forming gas.

According to a first aspect of the present disclosure, there is therefore provided an apparatus for plasma processing of a substrate transported continuously through the apparatus, as set out in the appended claims. Apparatuses according to aspects of the present disclosure comprise a first plasma torch. The first plasma torch comprises a first electrode and a second electrode arranged opposite the first electrode to define a first plasma discharge chamber between the first and second electrodes. The plasma discharge chamber comprises an inlet and an outlet for passing a plasma forming gas between the electrodes. The apparatus further comprises a control unit coupled to one or both the electrodes and operable to maintain an atmospheric pressure plasma discharge in the first plasma discharge chamber. The first plasma torch is therefore operable to exhaust plasma activated species through the outlet of the first plasma discharge chamber.

The apparatus further comprises an afterglow chamber downstream of the first plasma torch and in fluid communication with the outlet of the first plasma discharge chamber. A transport means is provided for continuous transport of the substrate through the afterglow chamber and such that the substrate is kept remote from the first plasma discharge chamber while being processed by plasma activated species exhausted from the outlet of the first plasma discharge chamber into the afterglow chamber.

According to a first aspect of the present disclosure, the afterglow chamber extends between a substrate inlet and a substrate outlet arranged at opposite sides of the outlet of the first plasma discharge chamber. The substrate inlet advantageously comprises an inlet aperture having a cross-sectional size substantially smaller than a cross-sectional size of the afterglow chamber. The cross-sectional size of the afterglow chamber can be assessed in correspondence of the outlet of the first plasma discharge chamber. The cross-sectional size can refer to an area, or clearance, such as a height, or diameter. Advantageously, the cross-sectional size is defined in a plane perpendicular to a transport direction of the substrate. Advantageously, the inlet aperture is aligned with a delimiting wall of the outlet of the first plasma discharge chamber, such that the afterglow chamber is made to extend at a downstream side only of the outlet of the first plasma discharge chamber.

The reduction in aperture of the afterglow chamber at the substrate inlet ensures that the afterglow zone is made to propagate further downstream along a transport direction of the substrate. An increased plasma treatment efficiency is thereby obtained. By appropriate selection of the aperture size, it becomes possible to reduce or minimize air entrainment by the substrate in the afterglow zone.

According to a second aspect of the present disclosure, which can be provided in addition to, or independently of the first aspect above, a second plasma torch is provided, which can be identical to the first plasma torch. The second plasma torch is aligned with and arranged opposite the first plasma torch, such that the outlets of the plasma discharge chambers of the respective plasma torches face each other and exhaust plasma activated species into the afterglow chamber interposed between the first and second plasma torches. A more intense afterglow stream is thereby provided, which furthermore allows for uniform treating continuous fibers along 360° of the circumference.

According to a third aspect of the present disclosure, there is provided a method for plasma treatment of continuous fibers, such as but not limited to carbon fibers and polymeric fibers.

Methods for indirect or remote atmospheric pressure plasma treatment of a substrate are described herein.

BRIEF DESCRIPTION OF THE DRAWINGS

Aspects of the present disclosure will now be described in more detail with reference to the appended drawings, wherein same reference numerals illustrate same features and wherein.

DETAILED DESCRIPTION

Figure 1:
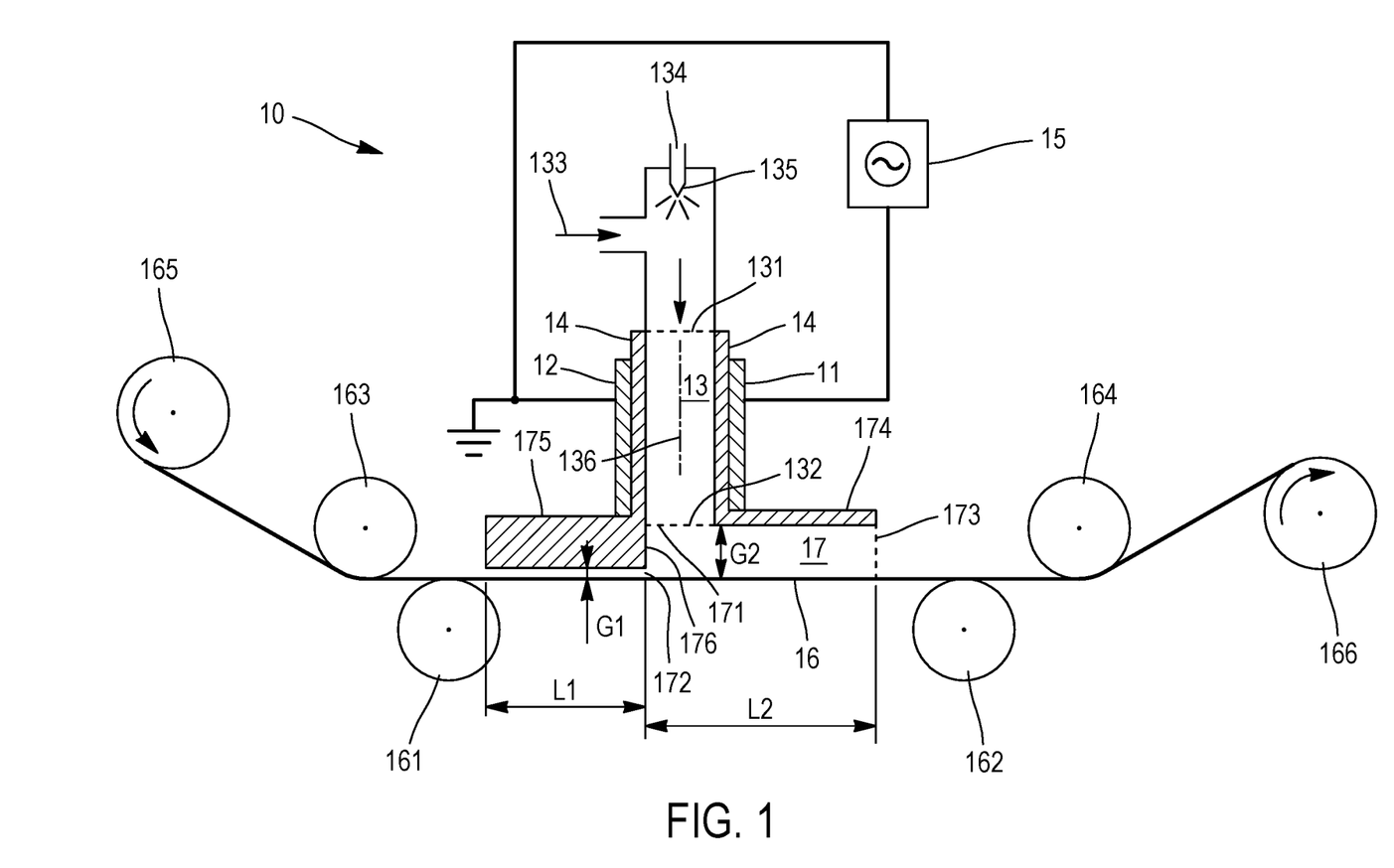
FIG. 1 represents a cross section side view of an apparatus for atmospheric pressure plasma processing of a film substrate according to aspects of the present disclosure.

Referring to FIG. 1, an apparatus 10 for plasma processing of a continuous substrate 16, such as but not limited to films and foils, comprises a pair of oppositely arranged electrodes 11 and 12. Electrodes 11 and 12 are planar and extend parallel to each other. They are spaced apart to define a plasma discharge chamber 13 between the electrodes 11, 12. Advantageously, dielectric layers 14 cover one or both electrodes 11, 12 at the side facing the plasma discharge chamber 13. In such case, the dielectric layers 14 form walls of the chamber 13. Dielectric materials include borosilicate glass, quartz, and alumina.

Chamber 13 comprises an inlet 131 through which a plasma forming gas 133 is made to enter the chamber. The plasma forming gas is one which is able to create a plasma discharge in chamber 13 under an electric field generated by the electrodes 11, 12. The plasma forming gas is advantageously a non-oxidizing gas, advantageously a gas which is substantially oxygen-free. Non-limiting examples of plasma forming gases are nitrogen ($N_2$), argon (Ar), helium (He) and neon (Ne), or combinations thereof.

The plasma forming gas is supplied to the chamber 13 at substantially atmospheric pressure. Suitable pressures may vary between about 0.5 bar below and about 0.5 bar above atmospheric pressure. The plasma forming gas may be supplied at ambient temperature (15° C.-30° C.) to the chamber 13. Alternatively, it is possible to heat the gas stream 133 to an elevated temperature prior to supplying it to the chamber 13. Elevated temperatures possibly range between 30° C. and 400° C., advantageously between 50° C. and 300° C.

The plasma forming gas enters the chamber at the inlet 131 and is made to flow along an axis 136 of chamber 13 until an outlet 132 arranged downstream of the electrodes 11, 12. The inlet 131 and the outlet 132 of the plasma discharge chamber 13 are defined by the extent of the plasma discharges taking place in chamber 13, i.e. it is assumed in the present description that the plasma discharge chamber 13 corresponds to and is delimited by the plasma discharge zone. Generally, the plasma discharge zone will be maintained in an area delimited by the electrodes 11, 12.

It will be convenient to note that, since the electrodes are planar, the chamber 13 (as well as electrodes 11, 12 and dielectric layers 14) extends in a direction perpendicular to axis 136, i.e. perpendicular to the plane of FIG. 1. The gap of chamber 13 between electrodes 11, 12 (between dielectric layers 14) typically is between 0.5 mm and 5 mm, advantageously 3 mm or less.

The plasma forming gas stream 133 can be loaded/enriched by at least one liquid or gaseous monomer added as a precursor to the plasma forming gas. The precursor can be activated by the plasma discharge to e.g. form radicals which initiate chemical reactions with the substrate 16. A stream 134 of precursor can be injected in the plasma forming gas stream 133 by known methods, such as through an atomizer 135, e.g. to form an aerosol which is carried with the plasma forming gas stream into the chamber 13. Non-limiting examples of precursors are methane ($CH_4$) and acetylene ($C_2H_2$).

The electrodes 11, 12 are coupled in an electric circuit including a control unit 15 which is operable to generate an electric/electromagnetic field between the electrodes 11, 12 that generates a plasma discharge in the chamber 13. By way of non-limiting example, one electrode 12 can be connected to electric ground, whereas the other electrode 11 is supplied with an Alternating Current (AC) or pulsed Direct Current (DC) high electric voltage generated in control unit 15. Suitable voltage differences between the electrodes 11, 12 range between 1 kV and 100 kV. Suitable frequencies (either AC or pulsed DC) range between 1 kHz and 200 kHz, advantageously between 5 kHz and 100 kHz.

The plasma setup of FIG. 1 is referred to as a parallel plate dielectric barrier discharge apparatus. The apparatus operates as a plasma torch which creates plasma activated species in the plasma discharge chamber. These species are carried by the plasma forming gas stream to the outlet 132 of chamber 13 where they are made to react with the substrate 16. It will be convenient to note that, although dielectric barrier discharge plasma processing provides advantageous operation, the present disclosure is not limited thereto and other kinds of plasma discharge, such as e.g. glow discharge or corona discharge may be contemplated.

Generally, the plasma activated species exiting the plasma discharge chamber retain their reactivity for a short period. A zone directly downstream of the outlet 132 of the plasma discharge chamber 13, where electromagnetic fields that sustained the plasma are absent or insufficient to maintain any plasma discharge, but where the plasma activated species are still reactive, is referred to as the afterglow zone. In the afterglow zone, the plasma activated species exiting the plasma discharge chamber react with other molecules, such as substrate molecules or recombine with molecules present in the plasma forming gas or other gas present in the afterglow zone.

The plasma treatment apparatus 10 is designed to treat substrate 16 in the afterglow zone, at a location remote from the plasma discharge chamber 13. To this end, substrate 16 is transported in proximity of the outlet 132 of the plasma discharge chamber 13, but without entering or contacting chamber 13 or the plasma discharge. Generally, the transport direction of substrate 16 is perpendicular to the axis 136 of flow of the plasma forming gas in chamber 13. By way of example the substrate 16 may be unwound from spool 165, guided along guide/tensioning drums 163 and 161 upstream of the plasma torch 10 and further along guide/tensioning drums 162 and 164 downstream to eventually be wound on a take-up spool 166.

According to an aspect of the present disclosure, a chamber 17 is provided downstream of the plasma discharge chamber 13, which allows for confining the afterglow. In the example of FIG. 1, the afterglow chamber 17 is defined/delimited by the substrate 16 on the one hand (in the assumption that substrate 16 is an impermeable film), and a confinement wall 174, advantageously made of a dielectric material, arranged opposite substrate 16 and advantageously parallel thereto. Substrate 16 is transported at a side opposite the outlet 132 of plasma discharge chamber 13. Wall 174 extends from outlet 132 along a direction advantageously parallel to the transport direction of substrate 16. The substrate 16 and wall 174 hence form a channel-shaped chamber 17 which advantageously guides the afterglow stream along the substrate 16. Afterglow chamber 17 comprises an inlet 171 for the plasma activated stream in fluid communication with and which advantageously corresponds to the outlet 132 of chamber 13 and an inlet 172 for the substrate 16, separate from inlet 171. Substrate inlet 172 is advantageously located at an upstream side of outlet 132 opposite wall 174, such that chamber 17 extends at the downstream side of the outlet 132 only. Both the afterglow stream and the substrate are transported in an advantageously same direction until outlet 173 of the chamber 17.

A shielding member 175 is advantageously provided at the substrate inlet 172. Shielding member 175 defines a wall 176 which advantageously extends between the outlet 132 of the plasma discharge chamber 13 and the substrate inlet 172, and reduces a clearance G1 between substrate 16 and the shielding member 175 at the substrate inlet 172 compared to a height G2 of the afterglow chamber 17. Height G2 can conveniently be assessed at the outlet 132, or further downstream, particularly in cases where the afterglow chamber would have a constant cross section. Wall 176 is advantageously aligned with a wall of the outlet 132.

One advantage of shielding member 175 is to ensure that the chamber 17 and hence the afterglow zone extends to the downstream side of the outlet 132 only. This results in a prolonged and more intimate contact between the reactive species present in the afterglow zone and the substrate 16. Another advantage of shielding member 175 is to reduce and/or minimize air entrainment by substrate 16 into the afterglow chamber 17. Air comprises oxidative species, such as oxygen, which neutralize the plasma activated species leading to reduced efficiency of the plasma treatment. Furthermore, the air entrained by the substrate 16 forms a boundary layer on the substrate surface hindering contact with the reactive species present in the afterglow zone.

As yet a further advantage, shielding member 175 avoids the necessity that the entire plasma processing zone be put under inert atmosphere. Therefore, aspects of the present disclosure allow for reducing gas consumption and therefore allow more economical plasma processing.

Advantageously, the clearance G1 is equal to or smaller than 50% of the clearance G2, advantageously equal to or smaller than 30%, advantageously equal to or smaller than 20%, advantageously equal to or smaller than 10% of clearance G2. The clearance G1 is advantageously equal to or smaller than 2.5 mm, advantageously equal to or smaller than 1 mm, advantageously equal to or smaller than 0.5 mm, advantageously equal to or smaller than 250 μm. The clearance G1 can be as small as 10 μm.

Advantageously, the clearance G2 is equal to or smaller than 10 mm, advantageously equal to or smaller than 7 mm, advantageously equal to or smaller than 5 mm. G2 is suitably at least 1 mm.

Advantageously, the afterglow chamber 17 extends over a distance L2 between the outlet 132 of the plasma discharge chamber and the outlet 173. The length L2 of the afterglow chamber is advantageously at least 100 mm, advantageously at least 200 mm, advantageously at least 500 mm.

It will be convenient to note that either one or both the afterglow chamber 17 and tunnel of the substrate inlet 172 can have a constant cross-section.

In an aspect of the present disclosure, it is advantageous to have substrate 16 pass through the substrate inlet 172 in a contactless manner. That is, substrate 16 enters the afterglow chamber 17 without contacting the shielding member 175 or the shielding wall 176, such that a clearance G1 is advantageously always present.

In order to further reduce air entrainment, shielding member 175 advantageously extends a distance L1 upstream along the transport direction of substrate 16. The clearance G1 may be maintained along the entire length L1 of shielding member 175. As a result, the substrate inlet 172 may be shaped as a tunnel with clearance G1, instead of just being an aperture or diaphragm. The length L1 of the tunnel is advantageously at least twice the clearance G1, advantageously at least three times G1, advantageously at least five times G1. A suitable length L is 10 to 20 times G1.

Figure 2:
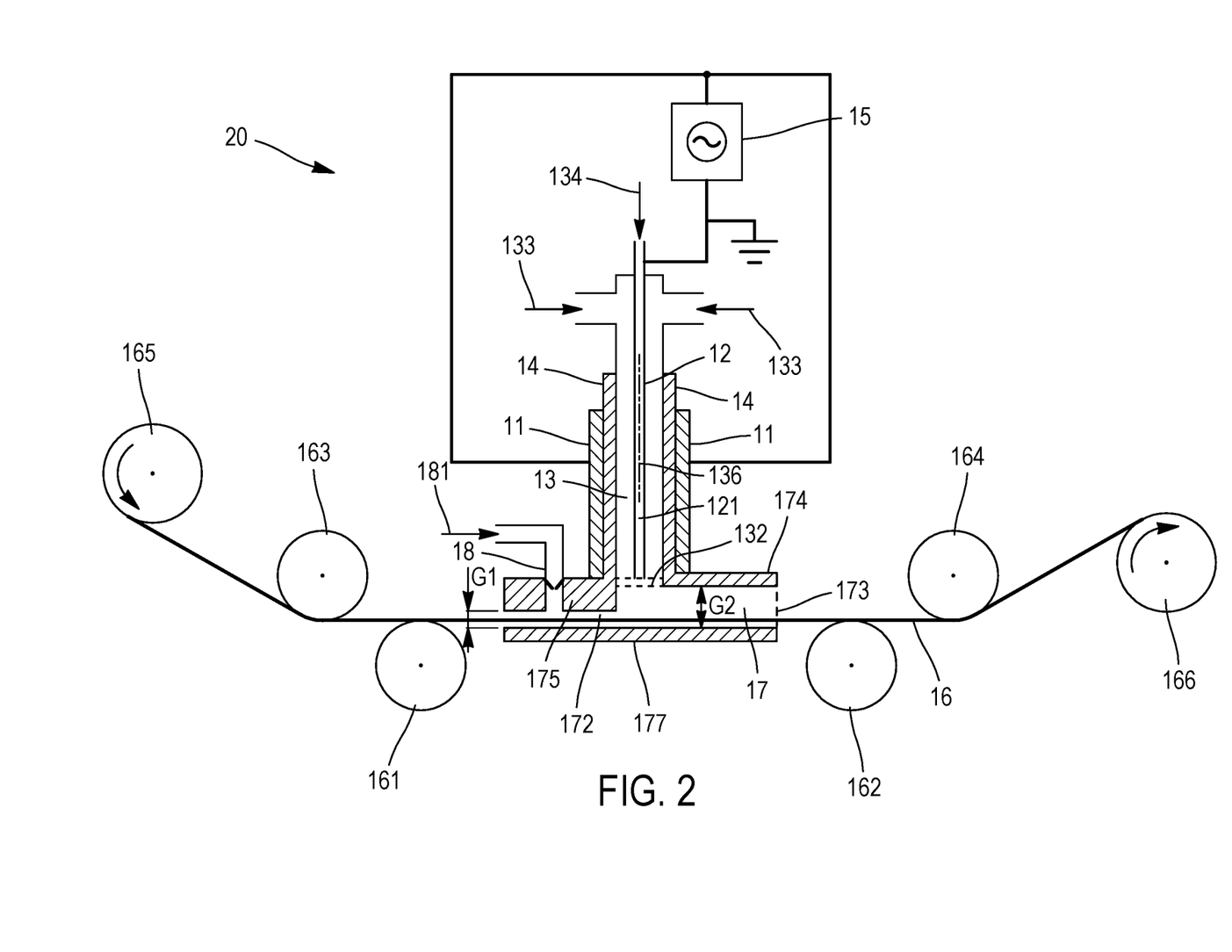
FIG. 2 represents a cross-section side view of another apparatus for atmospheric pressure plasma processing of a substrate according to aspects of the present disclosure.

In one aspect, the air entrainment by the substrate 16 through the substrate inlet 172 can be substantially completely suppressed by using a gas knife as shown in FIG. 2. Gas knife 18 injects a stream 181 of an inert or non-oxidizing gas, such as nitrogen gas, at the inlet 172. The stream 181 impinges on the substrate 16 to remove any entrained air.

Referring to FIG. 2, in case substrate 16 would be porous, a channel wall 177 is advantageously arranged opposite wall 174 and outlet 132 to confine the afterglow chamber 17. The substrate 16 is transported along the afterglow chamber 17 between walls 174 and 177. It will be convenient to note that in such case the clearances G1 and G2 are determined as from wall 177 instead of substrate 16.

FIG. 2 shows an alternative type of plasma torch 20, which differs from the plasma torch of apparatus 10 in that electrodes 11 are arranged at opposite sides of a central electrode 12. The outer electrodes 11 are advantageously supplied with high voltage, whereas the central electrode 12 is connected to ground. The central electrode 12 can comprise an internal lumen 121 advantageously extending until the outlet 132 of the plasma discharge chamber. The stream 134 of precursors is supplied through the internal lumen 121 and injected directly in the afterglow zone (chamber 17), where the precursors can react with the plasma activated species exhausted from the plasma discharge chamber. Such a setup is particularly suited in cases wherein it is not desired that the precursors be broken down by the plasma discharge.

The plasma torch 20 can be provided both as a parallel plate device, with planar electrodes 11 and 12, or as a cylindrical device, wherein electrodes 11 and 12 are circular and concentric, extending along axis 136.

Figure 3:
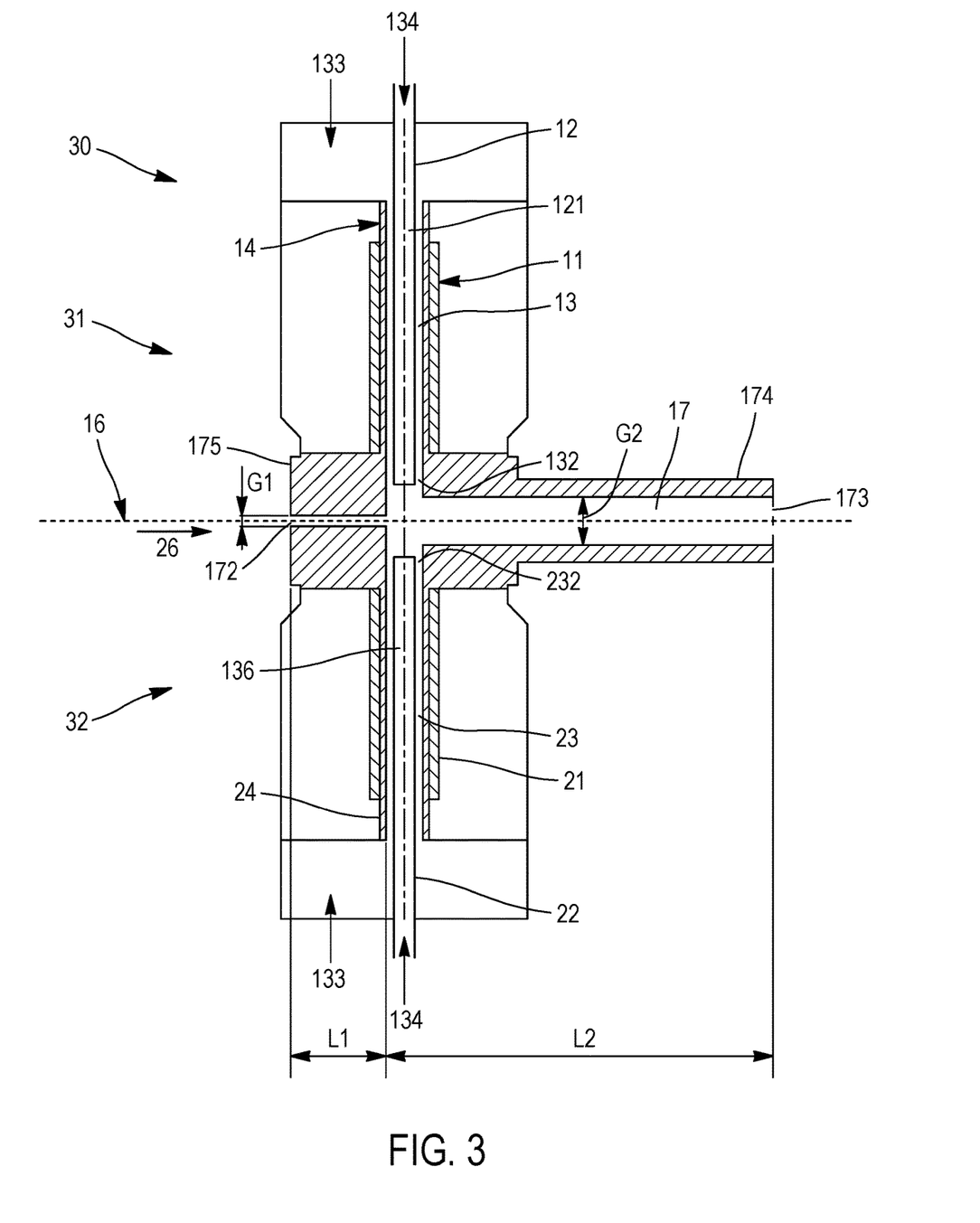
FIG. 3 represents a cross-section view of yet another apparatus for atmospheric pressure plasma processing of a fiber according to aspects of present disclosure, comprising two oppositely arranged cylindrical plasma torches.

Referring to FIG. 3, for cases in which the substrate 16 is to be plasma treated at both sides, it is advantageous to provide two plasma torches 31 and 32 arranged oppositely one another. Plasma processing apparatus 30 therefore comprises a first plasma torch 31, similar to anyone of the torches already described above. Plasma torch 31 shown in FIG. 3 is cylindrical and may have a same structure as torch 20 shown in FIG. 2. A second plasma torch 32, advantageously identical in structure as torch 31, is aligned with torch 31. Torch 32 comprises electrodes 21 and 22 spaced apart to define a plasma discharge chamber 23. A dielectric layer 24 is advantageously provided between either one of the electrodes and the plasma discharge chamber 23 as described. Plasma torches 31 and 32 are aligned on a same axis 136 and such that the respective outlets 132, 232 of the plasma discharge chambers 13, 23 are facing each other. The plasma activated species from plasma discharge chambers 13 and 23 are therefore exhausted towards each other in the afterglow chamber 17.

The afterglow chamber 17 is arranged between the outlets 132 and 232, and extends from the outlets downstream along a transport direction 26 of the substrate 16. The afterglow chamber 17 therefore receives plasma activated species from both plasma torches 31 and 32 so that a highly concentrated and uniform afterglow zone in chamber 17 can be obtained. The substrate 16 enters chamber 17 from a substrate inlet 172 having a reduced clearance as described above.

The plasma apparatus 30 is particularly suited for plasma processing of fibers, which require a 360° treatment of the fiber surface. In such case, torches 31 and 32 can be cylindrical, with concentric electrodes 11 and 12, and 21 and 22, all aligned on axis 136. With cylindrical plasma torches, the afterglow chamber 17 can be cylindrical as well, with fiber 16 being transported along the axis of the cylindrical chamber 17. In such case, wall 174 is advantageously tubular with circular cross-section.

A cylindrical afterglow chamber can comprise an upstream end at the outlets 132 and 232 of the plasma discharge chambers, which is defined by a shielding member 175 closing chamber 17 except for a small aperture through it which forms the substrate inlet 172. Substrate inlet 172 is advantageously aligned with the axis of tube 174. By so doing, the afterglow is conveyed through tube 174 in the same direction as the substrate 16 to obtain a longer afterglow zone along the substrate 16 and therefore a longer contact time.

It will be convenient to note that the values for the clearances G1 and G2 as indicated above advantageously apply to the diameters of the inlet 172 and the tube 174. By appropriate selection of dimension of the plasma torches 31 and 32, and the processing parameters such as plasma forming gas flow, a uniform afterglow zone in chamber 17 can be obtained allowing for a uniform 360° treatment of the fiber 16.

Elements of the plasma processing apparatuses described in relation to FIGS. 1 through 3 can be interchanged. In particular, two parallel plate plasma torches as in FIGS. 1 and 2 can be arranged oppositely as with the plasma torches 31 and 32 of FIG. 3 to obtain an afterglow channel 17 with rectangular cross-section and uniform afterglow zone, allowing the simultaneous treatment of a plurality of fibers.

Advantageously, the wall 174 and/or 177 of the afterglow chamber 17 is at least in part made of a transparent material, such as quartz glass. The transparent wall allows for checking the color and/or the length of the afterglow zone, which may be an indication of the purity of the gases used.

Apparatuses according to aspects of the present disclosure are particularly useful for plasma processing of carbon fibers. The fibers are drawn or pulled through the afterglow chamber and made to react with reactive species present in the afterglow zone. The fibers do not enter or come in contact with any of the plasma discharge zone(s) and do not suffer from charging effects due to the plasma discharge.

The invention claimed is:

1. An apparatus for plasma processing of a continuous fiber, the apparatus comprising:

a first plasma torch and a second plasma torch, wherein each of the first plasma torch and the second plasma torch comprises:

a first electrode and a second electrode, wherein the first electrode and the second electrode are spaced apart and are concentric on an axis, the first electrode being disposed within the second electrode, and a plasma discharge chamber between the respective first and second electrodes, wherein the plasma discharge chamber comprises an inlet and an outlet for passing a plasma forming gas between the first and second electrodes, wherein the first electrode comprises an internal lumen extending to the outlet of the plasma discharge chamber and configured to allow a stream of precursors to be supplied through the internal lumen and injected directly in an afterglow zone;

an afterglow chamber including the afterglow zone, wherein the afterglow chamber is in fluid communication with the outlets of the plasma discharge chambers of the first and second plasma torches and comprises a substrate inlet and a substrate outlet; and a transport system configured for continuous transport of the continuous fiber from the substrate inlet to the substrate outlet along a transport direction through the afterglow chamber such that the continuous fiber is kept remote from the plasma discharge chambers while being processed by plasma activated species flowing from the outlets of the plasma discharge chambers into the afterglow chamber;

wherein the substrate inlet of the afterglow chamber comprises an inlet aperture formed in an upstream wall of the afterglow chamber, and wherein the outlets of the plasma discharge chambers of the first plasma torch and the second plasma torch are arranged opposite one another with the afterglow chamber interposed between the outlets such that the upstream wall of the afterglow chamber is aligned with portions of respective walls of the outlets of each of the plasma discharge chambers;

wherein the outlets of the plasma discharge chambers of the first and second plasma torches are interposed between the substrate inlet and the substrate outlet;

wherein the inlet aperture has a cross-sectional size substantially smaller than a cross-sectional size of the afterglow chamber at the outlet of the plasma discharge chamber of the first plasma torch;

wherein the afterglow chamber extends from the upstream wall only in a downstream direction with respect to the transport direction of the continuous fiber;

wherein the upstream wall of the afterglow chamber partially defines the outlets of each of the plasma discharge chambers, and wherein the upstream wall comprises part of a shielding member configured to reduce air entrainment into the afterglow chamber by the continuous fiber; and wherein the shielding member defines a shielding wall which extends between the outlets of the plasma discharge chambers and the substrate inlet and is aligned with a wall of the outlets.

2. An apparatus for plasma processing of a continuous fiber, the apparatus comprising:
a first plasma torch and a second plasma torch, wherein each of the first plasma torch and the second plasma torch comprises:
a first electrode and a second electrode, wherein the first electrode and the second electrode are spaced apart and are concentric on an axis, the first electrode being disposed within the second electrode, and
a plasma discharge chamber between the respective first and second electrodes, wherein the plasma discharge chamber comprises an inlet and an outlet for passing a plasma forming gas between the first and second electrodes,
wherein the first electrode comprises an internal lumen extending to the outlet of the plasma discharge chamber and configured to allow a stream of precursors to be supplied through the internal lumen and injected directly in an afterglow zone;
an afterglow chamber including the afterglow zone, wherein the afterglow chamber is in fluid communication with the outlets of the plasma discharge chambers of the first and second plasma torches and comprises a substrate inlet and a substrate outlet; and
a transport system configured for continuous transport of the continuous fiber from the substrate inlet to the substrate outlet along a transport direction through the afterglow chamber such that the continuous fiber is kept remote from the plasma discharge chambers while being processed by plasma activated species flowing from the outlets of the plasma discharge chambers into the afterglow chamber;
wherein the substrate inlet of the afterglow chamber comprises an inlet aperture formed in an upstream wall of the afterglow chamber, and the outlets of the plasma discharge chambers of the first plasma torch and the second plasma torch are arranged opposite one another at an upstream end of the afterglow chamber with the afterglow chamber interposed between the outlets;

wherein the outlets of the plasma discharge chambers of the first and second plasma torches are interposed between the substrate inlet and the substrate outlet;

wherein the inlet aperture has a cross-sectional size substantially smaller than a cross-sectional size of the afterglow chamber at the outlet of the plasma discharge chamber of the first plasma torch;

wherein the afterglow chamber extends from the upstream wall only in a downstream direction with respect to the transport direction of the continuous fiber;

wherein the upstream wall of the afterglow chamber partially defines the outlets of each of the plasma discharge chambers, and wherein the upstream wall comprises part of a shielding member configured to reduce air entrainment into the afterglow chamber by the continuous fiber; and wherein the shielding member defines a shielding wall which extends between the outlets of the plasma discharge chambers and the substrate inlet and is aligned with a wall of the outlets.

3. The apparatus of claim 2, wherein the inlet aperture lies within a plane and at least a portion of each of the outlets of the plasma discharge chambers intersects or is tangential to the plane.

4. An apparatus for plasma processing of a continuous fiber, the apparatus comprising:
a first plasma torch and a second plasma torch, wherein each of the first plasma torch and the second plasma torch comprises:
a first electrode and a second electrode, wherein the first electrode and the second electrode are spaced apart and are concentric on an axis, the first electrode being disposed within the second electrode, and
a plasma discharge chamber between the respective first and second electrodes, wherein the plasma discharge chamber comprises an inlet and an outlet for passing a plasma forming gas between the first and second electrodes,
wherein the first electrode comprises an internal lumen extending to the outlet of the plasma discharge chamber and configured to allow a stream of precursors to be supplied through the internal lumen and injected directly in an afterglow zone;
an afterglow chamber including the afterglow zone, wherein the afterglow chamber is in fluid communication with the outlets of the plasma discharge chambers of the first and second plasma torches and comprises a substrate inlet and a substrate outlet; and
a transport system configured for continuous transport of the continuous fiber from the substrate inlet to the substrate outlet through the afterglow chamber such that the continuous fiber is kept remote from the plasma discharge chambers while being processed by plasma activated species flowing from the outlets of the plasma discharge chambers into the afterglow chamber;
wherein the outlets of the plasma discharge chambers of the first plasma torch and the second plasma torch are interposed between the substrate inlet and the substrate outlet and are arranged opposite one another, with the afterglow chamber interposed between the outlets of the plasma discharge chambers of the first and second plasma torches;
wherein the substrate inlet comprises an inlet aperture having a cross-sectional size substantially smaller than a cross-sectional size of the afterglow chamber at the outlet of the plasma discharge chamber of the first plasma torch;

wherein the inlet aperture is formed in an upstream wall of the afterglow chamber, wherein the upstream wall of the afterglow chamber partially defines the outlets of each of the plasma discharge chambers, and wherein the upstream wall comprises part of a shielding member configured to reduce air entrainment into the afterglow chamber by the continuous fiber; and wherein the shielding member defines a shielding wall which extends between the outlets of the plasma discharge chambers and the substrate inlet and is aligned with a wall of the outlets.

5. The apparatus of claim 4, wherein the first and second plasma torches are axially aligned.

6. The apparatus of claim 4, wherein the inlet aperture comprises a tunnel through the shielding member, and wherein a length of the tunnel is at least ten times as large as a cross-sectional width of the tunnel.

7. The apparatus of claim 4, wherein the substrate inlet is tubular comprising a first lumen, the transport system being operable for transporting the continuous fiber through the first lumen, and wherein the inlet aperture corresponds to the first lumen.

8. The apparatus of claim 7, wherein the first lumen has a length in a transport direction of the continuous fiber equal to or larger than twice a cross sectional size of the first lumen.

9. The apparatus of claim 7, wherein the afterglow chamber is tubular comprising a second lumen, wherein the second lumen fluidly communicates with the first lumen, wherein the transport system is operable for transporting the continuous fiber through the second lumen, and wherein a cross sectional size of the second lumen is at least twice a cross-sectional size of the first lumen.

10. The apparatus of claim 9, wherein the second lumen comprises a longitudinal axis extending between the substrate inlet and the substrate outlet.

11. The apparatus of claim 9, wherein the afterglow chamber is cylindrical.

12. The apparatus of claim 11, wherein the first lumen has a circular cross section having a diameter substantially smaller than a diameter of the afterglow chamber.

13. The apparatus of claim 4, further comprising a device operable to inject an inert gas on a surface of the continuous fiber at the substrate inlet.

14. The apparatus of claim 4, wherein each of the plasma discharge chambers defines an axis of flow of the plasma forming gas, the axis of flow being perpendicular to a transport direction of the continuous fiber in the afterglow chamber.

15. The apparatus of claim 4, wherein the first electrode of the first plasma torch is aligned with the first electrode of the second plasma torch, and the second electrode of the first plasma torch is aligned with the second electrode of the second plasma torch.

16. The apparatus of claim 4, wherein the first and second electrodes are cylindrical.

17. The apparatus of claim 4, wherein the afterglow chamber comprises a transparent wall.

18. The apparatus of claim 4, comprising a control unit coupled to the first electrode of each of the first plasma torch and the second plasma torch, wherein the control unit is operable to sustain an atmospheric pressure plasma discharge in the plasma discharge chambers of the first and second plasma torches.

19. A method of atmospheric pressure plasma processing of continuous carbon fibers using the apparatus of claim 1, wherein the continuous fiber is a carbon fiber and the method comprises transporting the carbon fiber through the apparatus.

* * * * *

UNITED STATES PATENT AND TRADEMARK OFFICE
CERTIFICATE OF CORRECTION

PATENT NO. : 12,080,525 B2
APPLICATION NO. : 17/713666
DATED : September 3, 2024
INVENTOR(S) : Annick Vanhulsel, Erwin Van Hoof and Jan Cools It is certified that error appears in the above-identified patent and that said Letters Patent is hereby corrected as shown below:

In the Claims

Column 12, Lines 32-33, Claim 19, the text "A method of atmospheric pressure plasma processing of continuous carbon fibers using the apparatus of claim 1," should read --A method of atmospheric pressure plasma processing of continuous carbon fibers using the apparatus of claim 4,--.

Signed and Sealed this
Fifteenth Day of October, 2024

Katherine Kelly Vidal
*Director of the United States Patent and Trademark Office*